United States Patent
Combrié et al.

(10) Patent No.: US 9,423,568 B2
(45) Date of Patent: Aug. 23, 2016

(54) DEVICE FOR ELECTRO-OPTICAL SAMPLING OF A MICROWAVE FREQUENCY SIGNAL

(71) Applicants: THALES, Neuilly sur Seine (FR); Université Pierre et Marie Curie (Paris 6), Paris (FR)

(72) Inventors: Sylvain Combrié, Palaiseau (FR); Alfredo De Rossi, Palaiseau (FR); Charlotte Tripon-Canseliet, Paris (FR); Jean Chazelas, Elancourt (FR)

(73) Assignees: THALES, Neuilly sur Seine (FR); Université Pierre et Marie Curie (Paris 6), Paris (FR)

( * ) Notice: Subject to any disclaimer, the term of this patent is extended or adjusted under 35 U.S.C. 154(b) by 0 days.

(21) Appl. No.: 14/684,102

(22) Filed: Apr. 10, 2015

(65) Prior Publication Data
US 2015/0333751 A1 Nov. 19, 2015

Related U.S. Application Data

(63) Continuation of application No. PCT/EP2013/071281, filed on Oct. 11, 2013.

(30) Foreign Application Priority Data

Oct. 11, 2012 (FR) .................... 12 02715

(51) Int. Cl.
*G02B 6/35* (2006.01)
*H03K 17/78* (2006.01)
*G08C 19/36* (2006.01)
*G01R 29/08* (2006.01)

(52) U.S. Cl.
CPC ............ *G02B 6/35* (2013.01); *G08C 19/36* (2013.01); *H03K 17/78* (2013.01); *G01R 29/0885* (2013.01)

(58) Field of Classification Search
CPC .......... G02B 6/35; H03K 17/78; G08C 19/36
See application file for complete search history.

(56) References Cited

U.S. PATENT DOCUMENTS

| 4,910,458 A * | 3/1990 | Forsyth | G01R 13/347 324/76.24 |
| 5,142,224 A * | 8/1992 | Smith | G01R 31/308 324/754.23 |

(Continued)

FOREIGN PATENT DOCUMENTS

EP 2144099 A1 1/2010

OTHER PUBLICATIONS

Wu et al., "Optoelectronic Phase Tracking and Electrooptic Sampling of Free-running Microwave Signals up to 20 GHz in a Laser-Diode-Based System," Jun. 1995, IEEE Photonics Technology Letters, vol. 7, No. 6, pp. 670-672.*

(Continued)

*Primary Examiner* — Daniel Petkovsek
(74) *Attorney, Agent, or Firm* — Knobbe, Martens, Olson & Bear, LLP

(57) ABSTRACT

A device for electro-optical sampling of a microwave frequency signal is disclosed. In one aspect, the device includes a microwave transmission line for transmitting a microwave signal, the microwave line including an interruption zone configured to be rendered conducting under the effect of an optical control signal so as to carry out a function of optically controlled interrupter switch. The device also includes, in the interruption zone, a layer of nanostructured semiconductor material, including a periodic or quasi-periodic tiling of nanostructures. The layer of nanostructured semiconductor material is placed, at the level of the interruption zone, in suspension or on a dielectric material of lower refractive index than the refractive index of the semiconductor material, the layer of nanostructured semiconductor material being able to carry out the function of optically controlled interrupter switch.

10 Claims, 3 Drawing Sheets

(56) References Cited

U.S. PATENT DOCUMENTS 5,239,181 A * 8/1993 Sun .................. H03K 17/78
250/551
5,847,569 A * 12/1998 Ho .................. G01R 1/06772
324/755.01

OTHER PUBLICATIONS

Delord, et al., Sampling of RF signals with LTG-GaAs based MSM structures, Lasers and Electro-Optics, 2007 and the International Quantum Electro ICS Conference, European Conference, IEEE, Jun. 1, 2007, pp. 1-1.

Joyce, et al., III-V semiconductor nanowires for optoelectronic device applications, Progress in Quantum Electronics, vol. 35, No. 2, Apr. 9, 2011, pp. 23-75.

Itatani et al., Ultrafast photoconductive switches fabricated by nano-anodization process on nano-clusters on InGaAs, Conference on Lasers and Electro-Optics, CLEO 2002 Technical Digest, Post-Conference Edition, Long Beach, CA, May 19-24, 2002, pp. 661-661.

International Search Report and Written Opinion dated Jan. 15, 2014, for Intl. Patent Application No. PCT/EP2013/071281 filed on Oct. 11, 2013.

* cited by examiner

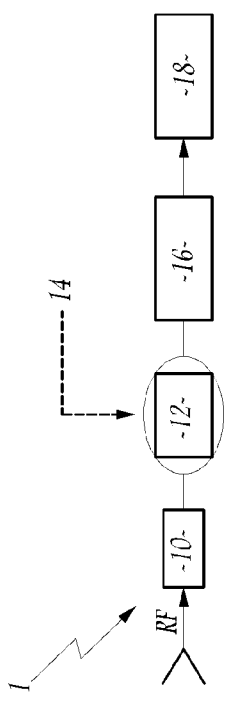
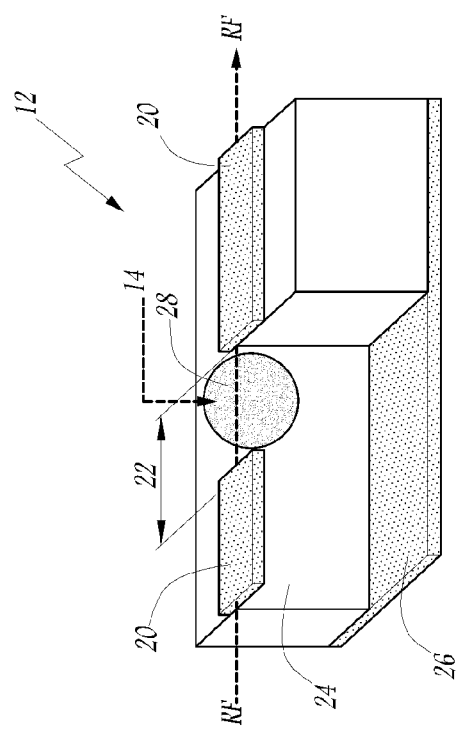

DEVICE FOR ELECTRO-OPTICAL SAMPLING OF A MICROWAVE FREQUENCY SIGNAL

CROSS-REFERENCE TO RELATED APPLICATIONS

This application is a continuation of International Application No. PCT/EP2013/071281, filed Oct. 11, 2013, which claims benefit under 35 U.S.C. §119 of French Application No. 12 02715, filed Oct. 11, 2012, which are herein incorporated by reference in their entirety.

BACKGROUND

1. Field

The described technology generally relates to a device for electro-optical sampling of a microwave frequency signal comprising a microwave transmission line for transmitting a microwave signal.

2. Description of the Related Art

The described technology is applicable in the field of electro-optical sampling of microwave signals, whereof the frequency band is in the range from several gigahertz (GHz) to several hundred GHz. A number of applications in the field of radar and telecommunications make use of such microwave signals.

It is a known technique to use for the sampling of microwave signals, carried by an interrupted microwave line, an interrupter switch controlled by a reference optical signal, or ultrafast optical "gate", which switches between an "open" state and a "closed" state at very specific time instants, in a cyclical timed manner, in order to sample the microwave electric signal. A mode-locked laser is used for the generation of the optical control signal in order to reduce the timing jitter. Such an optical signal controlled interrupter switch must have a fast response time, of the order of a picosecond.

At the present time there are known optically controlled interrupter switches manufactured out of epitaxial gallium arsenide (GaAs) semiconductor material at low temperature, which has an electronic band gap of 1.43 eV (electron volts). This semiconductor is rendered conducting by an optical signal of high power, having a wavelength of 0.8 µm. A mode-locked laser transmitting at 0.8 µm is relatively expensive, and in addition, a very high peak power is necessary for the switch to be effective.

A number of studies have focused on the development of an optically controlled interrupter switch that is sensitive to the wavelength of 1.5 µm, which takes advantage of less expensive components such as lasers and uses know-how developed in the field of telecommunications. In particular, the use of semiconductor material having lower electronic band gap has been studied.

However, the time for recombination of the carriers generated in such semiconductors is generally not sufficient for satisfying the constraint of a switching time of the order of a picosecond or indeed comes at the cost of degraded performance such as a significant dark current.

It is desirable to overcome the drawbacks of existing systems by offering an optically controlled interrupter switch for microwave line that is more efficient, and thus which requires a control signal of somewhat lower power, while having a switching time of the order of a picosecond.

SUMMARY OF CERTAIN INVENTIVE ASPECTS

To this end, one inventive aspect is an electro-optical sampling device for electro-optical sampling of a microwave frequency signal comprising a microwave transmission line for transmitting a microwave signal, the microwave line comprising an interruption zone able to be rendered conducting under the effect of an optical control signal so as to carry out a function of optically controlled interrupter switch.

The electro-optical sampling device comprises, in the interruption zone, a layer of nanostructured semiconductor material, comprising a periodic or quasi-periodic tiling of nanostructures, the semiconductor material having a refractive index, the layer of nanostructured semiconductor material being placed, at the level of the interruption zone, in suspension or on a dielectric material of lower refractive index than the refractive index of the semiconductor material, the layer of nanostructured semiconductor material being able to carry out the function of optically controlled interrupter switch.

Advantageously, the electro-optical sampling device according to certain aspects includes an optical signal-controlled interrupter switch produced by making use of a thin layer of nanostructured semiconductor material, which thereby makes it possible to enhance the light confinement effects provided by the control signal and consequently to reduce the power required to produce the onset of electrical conduction, and therefore the closure of the interrupter switch. In addition, the nano structuring increases the surface/volume ratio of the semiconductor material, and thus provides the ability to increase the rate of recombination of carriers generated and hence the switching speed of the interrupter switch.

According to another aspect, the layer of nanostructured semiconductor material comprises at least one resonant optical cavity formed by modification in the tiling of nano structures.

Advantageously, the use of one or more resonant optical cavities makes it possible to obtain the effects of non-linearity, in particular a two-photon absorption, which allows for the use of an optical control signal at 1.5 µm.

The electro-optical sampling device according to another aspect may have one or more of the following characteristic features, taken into consideration individually or in combination:

- the nanostructures are holes, and the modification consists of an omission, a change in diameter or a displacement in relation to the tiling of at least one hole;
- the modification consists of a localised or periodic omission of one or more holes in the tiling;
- the tiling is a periodic repetition of hexagonal patterns, the device comprising a plurality of resonant cavities formed by omission of the central hole of each hexagonal pattern;
- the resonant optical cavity provides for a linear or non-linear absorption for an optical control signal having a wavelength comprised within a range of 0.8 µm to 1.6 µm;
- the resonant optical cavity comprises a coupling device capable of promoting the absorption of an optical control signal of normal incidence relative to the layer of nanostructured semiconductor material;
- the semiconductor material forming the layer is an alloy of the family of group III-V semiconductors;
- the layer of nanostructured semiconductor material has a thickness comprised in a range of 100 to 400 nanometers;
- the tiling has an associated period, the period being selected based on the wavelength of the optical control signal and the refractive index of the semiconductor material that forms the layer of nanostructured semiconductor material.

BRIEF DESCRIPTION OF THE DRAWINGS

Other characteristic features and advantages of the described technology will become apparent from the description which is given here below, purely by way of information and without any limitation whatsoever, with reference made to the accompanying drawings, in which:

FIG. 1 is a schematic example of an electro-optical sampling chain;

FIG. 2 is a schematic view in perspective of an electro-optical sampling device;

DETAILED DESCRIPTION OF CERTAIN INVENTIVE EMBODIMENTS

Figure 3:
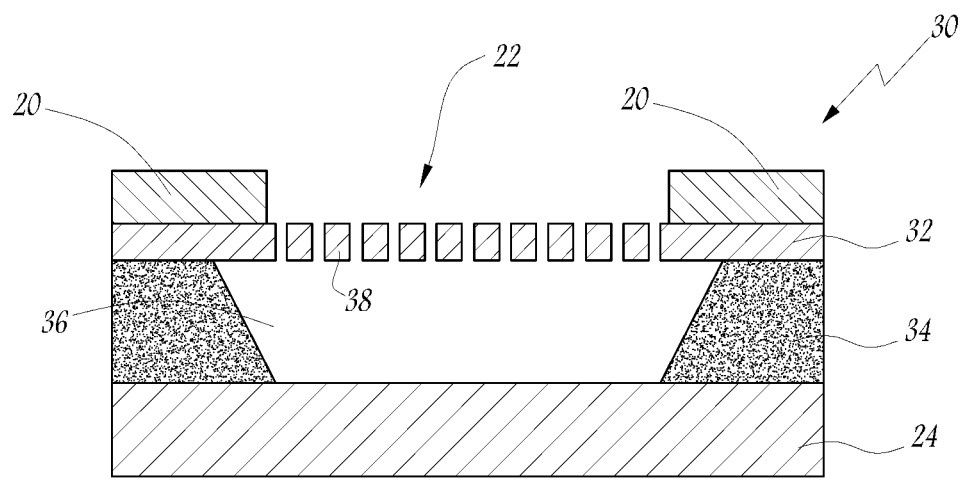
FIG. 3 is a cross sectional view of an electro-optical sampling device according to a first embodiment.

FIG. 1 represents an analogue/digital conversion circuit 1, in which a microwave signal RF arrives at the input of a filter 10 that is capable of filtering this signal in a predetermined frequency band. An electro-optical sampling device 12, denoted as S/H for "sample and hold", controlled by optical pulses 14, sent periodically, for example by a mode-locked laser, provides the ability to sample the filtered signal RF. The optical signal 14 is a clock signal which times the sampling of the filtered signal RF. Typically, the rate of such a signal is of the order of several tens of GHz. The resulting sampled signal obtained is sent to an analog-digital converter 16, and the resulting digital signal obtained is sent to a signal processor 18.

In a number of applications, in particular in the field of radar and telecommunications, it is possible to make use of such an electro-optical processing chain that carries out an analog to digital conversion of the microwave signal.

FIG. 2 details the electro-optical sampling device 12, which is an optically controlled interrupter switch for a microwave line in one embodiment.

In this embodiment, the microwave signal RF is conveyed over a transmission line 20 referred to as the microwave line, which is interrupted over a central interruption zone 22 having a width Lg. The microwave line 20 made of metallic conductive material rests on a semiconductor substrate 24. In the case of a microwave propagation line in a micro strip configuration, the entire assembly rests on an electrically conductive layer 26 which serves as a ground plane. In the case of a microwave transmission line in a coplanar configuration, which is a well known variant of the micro strip configuration, the ground plane is situated on either side of the transmission line.

In the central interruption zone 22, the zone 28, which is represented in a non-limiting manner in the spherical form, is the zone that becomes conductive by means of illumination by an optical signal 14.

Thus, when an optical signal of suitable power and wavelength, sent along a given incident angle, illuminates the zone 22, the zone 28 becomes conductive: when the light is absorbed, the carriers (electrons or holes) are released and move so as to recombine, which causes the zone 28 to become conductive between the two portions of the microwave line 20, which becomes a continuous transmission line, with the central interruption zone 22 then having the function of closed optically controlled interrupter switch.

Conversely, when the zone 22 is not illuminated by an optical signal, the zone 28 is non-conductive, desirably with a low dark current which ensures a significant resistance to the non-conductive state.

According to certain embodiments, the function of optically controlled interrupter switch is performed by the insertion of a layer of nanostructured semiconductor material, with the nanostructuring being present over at least one portion of the interruption zone 22 situated between the two portions of the microwave line, as represented in the examples shown in FIGS. 3 to 8.

Thus, according to a first embodiment illustrated in FIG. 3, an electro-optical sampling device 30 includes a layer 32 of semiconductor material, comprising a nanostructuring at the level of the interruption zone 22, over at least one portion of the zone located between the two ends of the microwave line 20, on both sides of the interruption zone. The layer 32 is inserted between the microwave line 20 and the layer of substrate formed of semiconductor material 24.

In this embodiment, the layer of nano-structured material 32 rests on a sacrificial layer 34 at the level of the microwave conductive parts 20. The sacrificial layer 34 is made of dielectric material.

The layer 32 of nano-structured material is suspended, and thus surrounded by air below and above. In a more general manner, the layer 32 is rested on a dielectric material 36 whose refractive index is lower than the refractive index of the semiconductor material forming the layer 32, for example Silicon dioxide ($SiO_2$), Silicon Nitride (SiN), Aluminum Oxide ($Al_2O_3$). In this case, the sacrificial layer 34 may be made of the same dielectric material 36.

Such a dielectric material 36 having a low refractive index can also be placed above the layer 32. According to one variant, the holes are filled with a dielectric material having a low refractive index, that is analogous to the dielectric material 36 described here above.

The semiconductor material of the layer 32 is a material of the family of group III-V semiconductor alloys, desirably gallium arsenide (GaAs), or indium phosphide (InP), or group III-V alloys lattice matched with GaAs or InP.

The nanostructures 38 are desirably holes, formed in a membrane of the semiconductor material of the type mentioned here above, repeated based on a periodic or quasi-periodic tiling, as is illustrated here below, in particular in FIG. 5.

The pattern of the tiling is desirably of hexagonal type. By way of a variant, the pattern of the tiling is square or a combination type such as Penrose tiling.

The period of the tiling a, which is the distance between the centres of two consecutive holes along one direction, is comprised between 250 and 600 nanometers (nm). The diameter of the holes is of the order of 0.4 to 0.8 times the period a. It is to be noted that in this example the holes have a circular cross section, but by way of a variant, other geometric shapes may be envisaged. The circular shape however has the advantage of ease of implementation.

In order to obtain a reinforcement of the absorption of energy by the optical control signal at the level of the nanostructuring, desirably the period a is of the order of λ/n, where λ is the wavelength of the optical control signal and n is the refractive index of the semiconductor material forming the layer 32. The period of repetition of the nanostructures is thus desirably chosen on the basis of the wavelength of the optical control signal.

The membrane that forms the layer 32 has a thickness comprised between 130 nm and 400 nm, for example a thickness of 200 nm. In a general manner, the thickness of the membrane is of the order of 0.3 to 1 times the period a.

Advantageously, the nanostructuring makes it possible to accelerate the process of linear absorption when the semiconductor material is controlled by an optical control signal having a wavelength corresponding to the wavelength absorbed by the material. Thus, the operation is improved even when the semiconductor used is GaAs, with absorption at 0.8 μm.

In addition, the nanostructuring makes it possible to increase the rate of recombination of the photo-generated carriers, on account of the increase in the surface/volume ratio, which results in the faster operation of the sampling device 30 with optically controlled interrupter switch.

Figure 4:
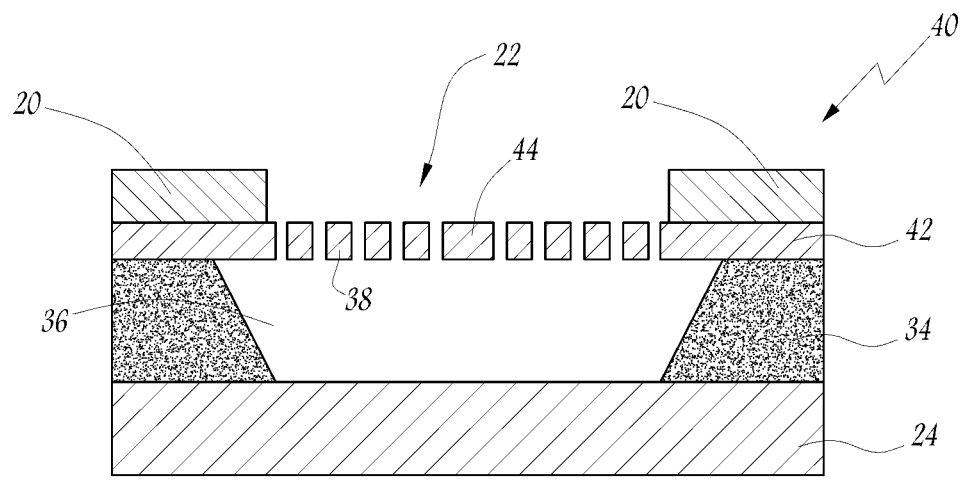
FIG. 4 is a cross sectional view of an electro-optical sampling device according to a second embodiment.

In a second embodiment illustrated in FIG. 4, an electro-optical sampling device 40 makes possible the use thereof with an optical control signal having wavelength equal to 1.5 μm.

In the embodiment illustrated in FIG. 4, the layer of nanostructured material 42 comprises a resonant optical cavity 44, formed by localised modification of the tiling or insertion of a defect in the tiling, here by omission of a hole between two nano structures 38.

By way of a variant, a resonant optical cavity is obtained by localised modification of the size of the nanostructures or by displacement of nanostructures, thus by local modification of the period of the nanostructures.

The resonant optical cavity makes possible the local confinement of the electromagnetic field and a two-photon non-linear absorption effect. The two-photon absorption is brought about by means of excitation by the optical signal at a wavelength of 1.5 μm only in the interruption zone 22 between the two portions 20 of the microwave line, around the resonant optical cavity 44, since the semiconductor material that forms the layer 42 does not exhibit absorption at this wavelength.

Advantageously, the optical control signal acts in a localised and effective manner at the level of the interruption zone 22, the effect of release of the carriers being brought about when the peak power of the optical control signal reaches 100 mW.

Figure 5:
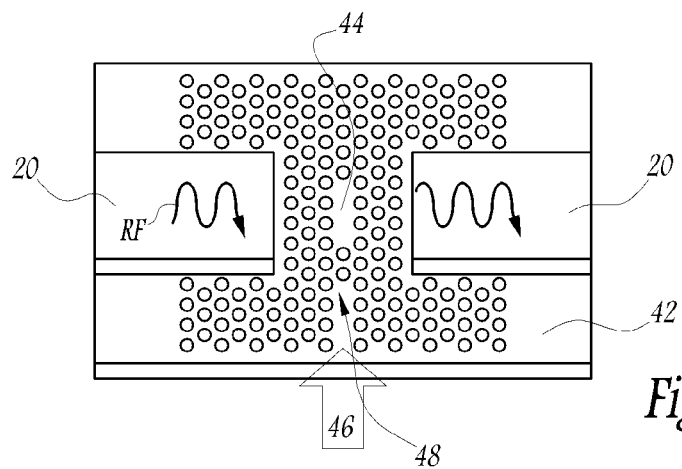
FIG. 5 is a view from above of an electro-optical sampling device according to a third embodiment, having a resonant optical cavity that is optically controlled based on waveguide.

FIG. 5 illustrates a third embodiment, corresponding to the embodiment shown in FIG. 4 in a view from above, with a nanostructured layer 42 in which the tiling has a hexagonal pattern.

As illustrated in FIG. 5, the optical control signal 46 is carried by a waveguide 48 in the plane of the nanostructured layer 42. The waveguide 48 is formed by a line of missing holes as illustrated in FIG. 5.

By way of a variant, the control signal may be carried by a waveguide that is situated in an underlying plane.

Figure 6:
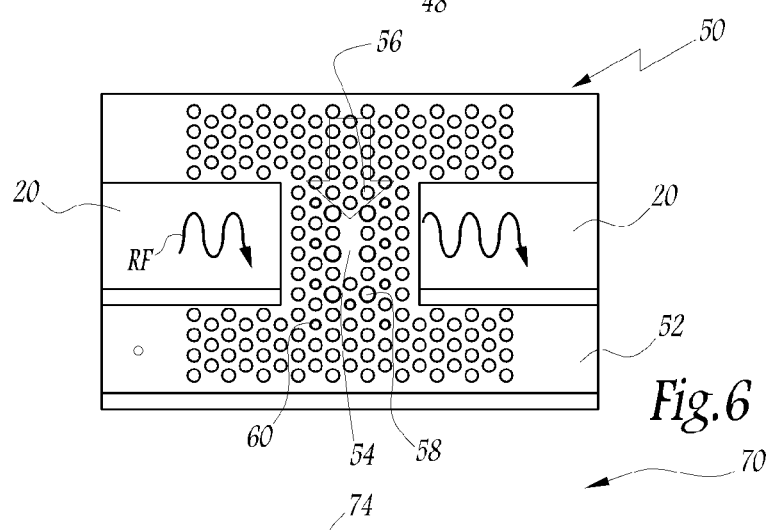
FIG. 6 is a view from above of an electro-optical sampling device according to a fourth embodiment, having a resonant optical cavity with optical control based on normal incidence.

By way of a variant, according to a fourth embodiment shown in FIG. 6, an electro-optical device 50 comprises a nanostructured layer 52 having a resonant cavity 54 situated in the interruption zone of the microwave line, formed by the omission of holes as in the embodiment illustrated in FIG. 3. The optical control signal 56 is forwarded at normal incidence, along a direction that is substantially perpendicular to the nanostructured layer 52, the coupling being effected by means of application of the technology referred to as folding of bands or "band folding" described in particular in the patent application EP2144099. This technology consists of locally modifying the size of the nanostructures around the resonant optical cavity 46, in order to locally create a band folding so as to focus maximum energy in a very tight directivity cone. Thus, as can be seen in FIG. 6, the holes 58 having a larger diameter than the holes of the regular tiling and the holes 60 having a smaller diameter than the holes of the regular tiling are made in the semiconductor membrane that forms the nanostructured layer 52. These holes 58, 60 form a coupling mechanism, added to the resonant cavity 54 and promoting the absorption of photons of an optical signal at normal incidence.

By way of a variant, other embodiments of such a coupling device as the one shown in FIG. 6 are operationally implemented.

Figure 7:
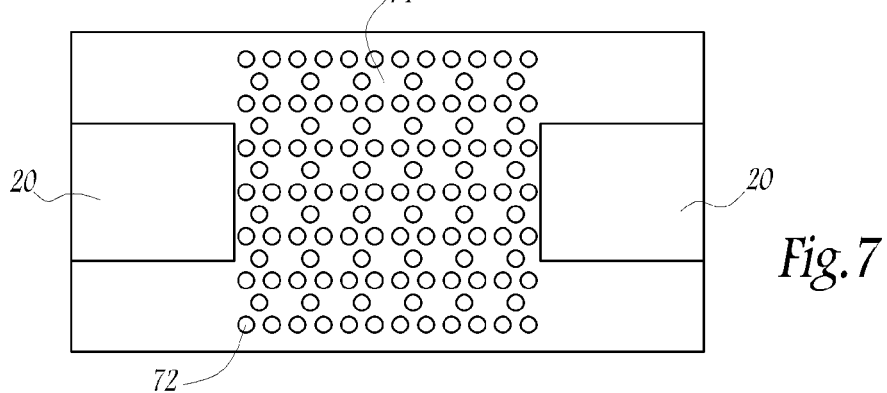
FIG. 7 is a view from above of an electro-optical sampling device according to a fifth embodiment.

According to a fifth embodiment illustrated in FIG. 7, which represents an electro-optical device 70 in a view from above, the nanostructured layer 72 includes a plurality of resonant optical cavities 74. The cavities are obtained by the systematic omission of the central hole in a regular hexagonal tiling, based on a graphite like structure. In this embodiment, each missing hole acts like a single resonant cavity.

Figure 8:
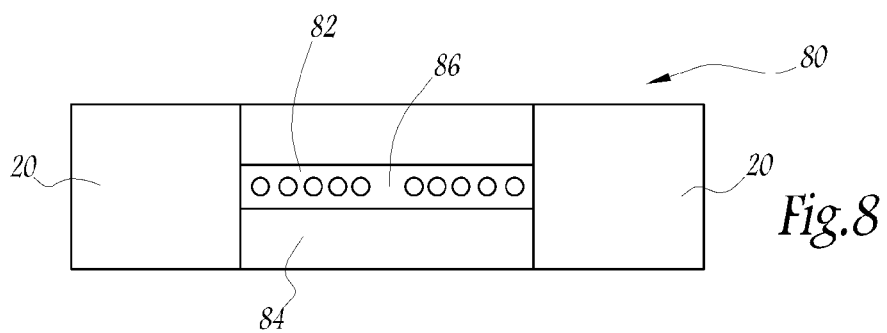
FIG. 8 is a view from above of an electro-optical sampling device according to a sixth embodiment.

According to a sixth embodiment illustrated in FIG. 8, which represents an electro-optical device 80 in a view from above, the nanostructured layer 82, which is suspended above the substrate 84, is one dimensional, and comprises a resonant optical cavity 86 formed by the absence of a hole in the nanostructured line having regular period formed in a membrane of a semiconductor material. By way of a variant, a plurality of such nanostructured lines, for example parallel, are present in the electro-optical device.

Advantageously, an electro-optical sampling device operates with an optical control signal having a wavelength comprised between 0.8 μm and 1.6 μm and with a switching time of the order of a picosecond.

While there have been shown and described and pointed out the fundamental novel features of the invention as applied to certain inventive embodiments, it will be understood that the foregoing is considered as illustrative only of the principles of the invention and not intended to be exhaustive or to limit the invention to the precise forms disclosed. Obvious modifications or variations are possible in light of the above teachings. The embodiments discussed were chosen and described to provide the best illustration of the principles of the invention and its practical application to enable one of ordinary skill in the art to utilize the invention in various embodiments and with various modifications as are suited to the particular use contemplate. All such modifications and variations are within the scope of the invention as determined by the appended claims when interpreted in accordance with the breadth to which they are entitled.

The invention claimed is:

1. An electro-optical sampling device for electro-optical sampling of a microwave frequency signal comprising:
    a microwave transmission line configured to transmit a microwave signal, the microwave transmission line comprising an interruption zone configured to be rendered conducting under the effect of an optical control signal so as to carry out a function of optically controlled interrupter switch, wherein the device further comprises, in the interruption zone, a layer of nanostructured semiconductor material comprising a periodic or quasi-periodic tiling of nanostructures, the semiconductor material having a refractive index, the layer of nanostructured semiconductor material being placed, at the level of the interruption zone, in suspension or on a dielectric material of lower refractive index than the refractive index of the semiconductor material, the layer of nanostructured semiconductor material configured to carry out the function of optically controlled interrupter switch.

2. The electro-optical sampling device of claim 1, wherein the layer of nanostructured semiconductor material comprises at least one resonant optical cavity formed by modification in the tiling of nanostructures.

3. The electro-optical sampling device of claim 2, wherein the nanostructures are holes, and wherein the modification consists of an omission, a change in diameter or a displacement in relation to the tiling of at least one hole.

4. The electro-optical sampling device of claim 3, wherein the modification consists of a localised or periodic omission of one or more holes in the tiling.

5. The electro-optical sampling device of claim 3, wherein the tiling is a periodic repetition of hexagonal patterns comprising a plurality of resonant cavities formed by omission of the central hole of each hexagonal pattern.

6. The electro-optical sampling device of claim 2, wherein the resonant optical cavity provides for a linear or non-linear absorption for an optical control signal having a wavelength within the range of 0.8 µm to 1.6 µm.

7. The electro-optical sampling device of claim 2, wherein the resonant optical cavity comprises a coupling device configured to promote the absorption of an optical control signal of normal incidence relative to the layer of nanostructured semiconductor material.

8. The electro-optical sampling device of claim 1, wherein the semiconductor material forming the layer of nanostructured semiconductor material is an alloy of the family of group III-V semiconductors.

9. The electro-optical sampling device of claim 1, wherein the layer of nanostructured semiconductor material has a thickness in the range of 100 to 400 nanometers.

10. The electro-optical sampling device according to claim 1, wherein the optical control signal has a given wavelength and the tiling has an associated period, the period being selected based on the wavelength of the optical control signal and the refractive index of the semiconductor material that forms the layer of nanostructured semiconductor material.

* * * * *